US006389506B1

(12) United States Patent
Ross et al.

(10) Patent No.: US 6,389,506 B1
(45) Date of Patent: May 14, 2002

(54) BLOCK MASK TERNARY CAM

(75) Inventors: Mark Ross; Andreas V. Bechtolsheim, both of San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/130,890

(22) Filed: Aug. 7, 1998

(51) Int. Cl.⁷ .............................................. G06F 12/00
(52) U.S. Cl. ......................... 711/108; 711/108; 365/49
(58) Field of Search ............................ 711/108; 365/49

(56) References Cited

U.S. PATENT DOCUMENTS

| | | | |
|---|---|---|---|
| 4,131,767 A | | 12/1978 | Weinstein |
| 4,161,719 A | | 7/1979 | Parikh et al. |
| 4,316,284 A | | 2/1982 | Howson |
| 4,397,020 A | | 8/1983 | Howson |
| 4,419,728 A | | 12/1983 | Larson |
| 4,424,565 A | | 1/1984 | Larson |
| 4,437,087 A | | 3/1984 | Petr |
| 4,438,511 A | | 3/1984 | Baran |
| 4,439,763 A | | 3/1984 | Limb |
| 4,445,213 A | | 4/1984 | Baugh et al. |
| 4,446,555 A | | 5/1984 | Devault et al. |
| 4,456,957 A | | 6/1984 | Schieltz |
| 4,464,658 A | | 8/1984 | Thelen |
| 4,491,945 A | * | 1/1985 | Turner ........................ 370/409 |
| 4,499,576 A | | 2/1985 | Fraser |
| 4,506,358 A | | 3/1985 | Montgomery |

(List continued on next page.)

FOREIGN PATENT DOCUMENTS

| | | |
|---|---|---|
| EP | 0 384 758 A2 | 8/1990 |
| EP | 0 431 751 A1 | 6/1991 |
| EP | 0 567 217 A2 | 10/1993 |
| WO | WO93/07569 | 4/1993 |
| WO | WO93/07692 | 4/1993 |
| WO | WO94/01828 | 1/1994 |
| WO | WO95/20850 | 8/1995 |

OTHER PUBLICATIONS

Teuvo Kohonen "content addressable memory" Springer–Verlag 1987, pp. 128–129, 142–144.*

Allen, M., "Novell IPX Over Various WAN Media (IPXWAN)," Network Working Group, RFC 1551, Dec. 1993, pp. 1–22.

Becker, D., "3c589.c: A 3c589 EtherLink3 ethernet driver for linux," becker@CESDIS.gsfc.nasa.gov, May 3, 1994, pp. 1–13.

(List continued on next page.)

*Primary Examiner*—Do Hyun Yoo
*Assistant Examiner*—Mehdi Namazi

(57) ABSTRACT

A method and system for flexible matching of data in a CAM that does not use the overhead of one mask bit for each matched value bit. The entries of the CAM are logically grouped in a set of blocks, each block having a single mask that applies to all entries in the block. Each block includes a predetermined number of CAM entries, such as a block of 16 entries. However, in alternative embodiments, the number of CAM entries for each block could be predetermined to be a different number, or could be dynamically selected with the values that are entered into the CAM.

38 Claims, 3 Drawing Sheets

U.S. PATENT DOCUMENTS

| | | |
|---|---|---|
| 4,507,760 A | 3/1985 | Fraser |
| 4,532,626 A | 7/1985 | Flores et al. |
| 4,644,532 A | 2/1987 | George et al. |
| 4,646,287 A | 2/1987 | Larson et al. |
| 4,677,423 A | 6/1987 | Benvenuto et al. |
| 4,679,189 A | 7/1987 | Olson et al. |
| 4,679,227 A | 7/1987 | Hughes-Hartogs |
| 4,723,267 A | 2/1988 | Jones et al. |
| 4,731,816 A | 3/1988 | Hughes-Hartogs |
| 4,750,136 A | 6/1988 | Arpin et al. |
| 4,757,495 A | 7/1988 | Decker et al. |
| 4,763,191 A | 8/1988 | Gordon et al. |
| 4,769,810 A | 9/1988 | Eckberg, Jr. et al. |
| 4,769,811 A | 9/1988 | Eckberg, Jr. et al. |
| 4,771,425 A | 9/1988 | Baran et al. |
| 4,819,228 A | 4/1989 | Baran et al. |
| 4,827,411 A | 5/1989 | Arrowood et al. |
| 4,833,706 A | 5/1989 | Hughes-Hartogs |
| 4,835,737 A | 5/1989 | Herrig et al. |
| 4,879,551 A | 11/1989 | Georgiou et al. |
| 4,893,306 A | 1/1990 | Chao et al. |
| 4,903,261 A | 2/1990 | Baran et al. |
| 4,922,486 A | 5/1990 | Lidinsky et al. |
| 4,933,937 A | 6/1990 | Konishi |
| 4,960,310 A | 10/1990 | Cushing |
| 4,962,497 A | 10/1990 | Ferenc et al. |
| 4,962,532 A | 10/1990 | Kasirai et al. |
| 4,965,767 A | 10/1990 | Kinoshita et al. ............. 365/49 |
| 4,965,772 A | 10/1990 | Daniel et al. |
| 4,970,678 A | 11/1990 | Sladowski et al. |
| 4,979,118 A | 12/1990 | Kheradpir .................. 364/436 |
| 4,980,897 A | 12/1990 | Decker et al. |
| 4,991,169 A | 2/1991 | Davis et al. |
| 5,003,595 A | 3/1991 | Collins et al. |
| 5,014,265 A | 5/1991 | Hahne et al. |
| 5,020,058 A | 5/1991 | Holden et al. |
| 5,033,076 A | 7/1991 | Jones et al. |
| 5,034,919 A | 7/1991 | Sasai et al. ................... 365/49 |
| 5,054,034 A | 10/1991 | Hughes-Hartogs |
| 5,059,925 A | 10/1991 | Weisbloom |
| 5,072,449 A | 12/1991 | Enns et al. |
| 5,088,032 A | 2/1992 | Bosack |
| 5,095,480 A | 3/1992 | Fenner |
| RE33,900 E | 4/1992 | Howson |
| 5,115,431 A | 5/1992 | Williams et al. |
| 5,128,945 A | 7/1992 | Enns et al. |
| 5,136,580 A | 8/1992 | Videlock et al. |
| 5,166,930 A | 11/1992 | Braff et al. |
| 5,199,049 A | 3/1993 | Wilson |
| 5,206,886 A | 4/1993 | Bingham |
| 5,208,811 A | 5/1993 | Kashio et al. |
| 5,212,686 A | 5/1993 | Joy et al. |
| 5,224,099 A | 6/1993 | Corbalis et al. |
| 5,226,120 A | 7/1993 | Brown et al. |
| 5,228,062 A | 7/1993 | Bingham |
| 5,229,994 A | 7/1993 | Balzano et al. |
| 5,237,564 A | 8/1993 | Lespagnol et al. |
| 5,241,682 A | 8/1993 | Bryant et al. |
| 5,243,342 A | 9/1993 | Kattemalalavadi et al. |
| 5,243,596 A | 9/1993 | Port et al. |
| 5,247,516 A | 9/1993 | Bernstein et al. |
| 5,249,178 A | 9/1993 | Kurano et al. |
| 5,253,251 A | 10/1993 | Aramaki |
| 5,255,291 A | 10/1993 | Holden et al. |
| 5,260,933 A | 11/1993 | Rouse |
| 5,260,978 A | 11/1993 | Fleischer et al. |
| 5,268,592 A | 12/1993 | Bellamy et al. |
| 5,268,900 A | 12/1993 | Hluchyj et al. |
| 5,271,004 A | 12/1993 | Proctor et al. |
| 5,274,631 A | 12/1993 | Bhardwaj |
| 5,274,635 A | 12/1993 | Rahman et al. |
| 5,274,643 A | 12/1993 | Fisk |
| 5,280,470 A | 1/1994 | Buhrke et al. |
| 5,280,480 A | 1/1994 | Pitt et al. |
| 5,280,500 A | 1/1994 | Mazzola et al. |
| 5,283,783 A | 2/1994 | Nguyen et al. |
| 5,287,103 A | 2/1994 | Kasprzyk et al. |
| 5,287,453 A | 2/1994 | Roberts |
| 5,291,482 A | 3/1994 | McHarg et al. |
| 5,305,311 A | 4/1994 | Lyles |
| 5,307,343 A | 4/1994 | Bostica et al. |
| 5,309,437 A | 5/1994 | Perlman et al. .......... 730/85.13 |
| 5,311,509 A | 5/1994 | Heddes et al. |
| 5,313,454 A | 5/1994 | Bustini et al. |
| 5,313,582 A | 5/1994 | Hendel et al. |
| 5,317,562 A | 5/1994 | Nardin et al. |
| 5,319,644 A | 6/1994 | Liang |
| 5,327,421 A | 7/1994 | Hiller et al. |
| 5,331,637 A | 7/1994 | Francis et al. |
| 5,345,445 A | 9/1994 | Hiller et al. |
| 5,345,446 A | 9/1994 | Hiller et al. |
| 5,359,592 A | 10/1994 | Corbalis et al. |
| 5,361,250 A | 11/1994 | Nguyen et al. |
| 5,361,256 A | 11/1994 | Doeringer et al. |
| 5,361,259 A | 11/1994 | Hunt et al. |
| 5,365,524 A | 11/1994 | Hiller et al. |
| 5,367,517 A | 11/1994 | Cidon et al. |
| 5,371,852 A | 12/1994 | Attanasio et al. |
| 5,383,146 A * | 1/1995 | Threewitt .................... 365/49 |
| 5,386,567 A | 1/1995 | Lien et al. |
| 5,390,170 A | 2/1995 | Sawant et al. |
| 5,390,175 A | 2/1995 | Hiller et al. |
| 5,394,394 A | 2/1995 | Crowther et al. |
| 5,394,402 A | 2/1995 | Ross |
| 5,400,325 A | 3/1995 | Chatwani et al. |
| 5,408,469 A | 4/1995 | Opher et al. |
| 5,416,842 A | 5/1995 | Aziz |
| 5,422,880 A | 6/1995 | Heitkamp et al. |
| 5,422,882 A | 6/1995 | Hiller et al. |
| 5,423,002 A | 6/1995 | Hart |
| 5,426,636 A | 6/1995 | Hiller et al. |
| 5,428,607 A | 6/1995 | Hiller et al. |
| 5,430,715 A | 7/1995 | Corbalis et al. |
| 5,430,729 A | 7/1995 | Rahnema |
| 5,440,715 A * | 8/1995 | Wyland ...................... 711/108 |
| 5,442,457 A | 8/1995 | Najafi |
| 5,442,630 A | 8/1995 | Gagliardi et al. |
| 5,452,297 A | 9/1995 | Hiller et al. |
| 5,473,599 A | 12/1995 | Li et al. |
| 5,473,607 A | 12/1995 | Hausman et al. |
| 5,477,541 A | 12/1995 | White et al. |
| 5,485,455 A | 1/1996 | Dobbins et al. |
| 5,490,140 A | 2/1996 | Abensour et al. |
| 5,490,258 A | 2/1996 | Fenner |
| 5,491,687 A | 2/1996 | Christensen et al. |
| 5,491,804 A | 2/1996 | Heath et al. |
| 5,497,368 A | 3/1996 | Reijnierse et al. |
| 5,504,747 A | 4/1996 | Sweasey |
| 5,509,006 A | 4/1996 | Wilford et al. |
| 5,517,494 A | 5/1996 | Green |
| 5,519,704 A | 5/1996 | Farinacci et al. |
| 5,519,858 A | 5/1996 | Walton et al. ............... 395/600 |
| 5,526,489 A | 6/1996 | Nilakantan et al. |
| 5,530,963 A | 6/1996 | Moore et al. |
| 5,535,195 A | 7/1996 | Lee |
| 5,539,734 A | 7/1996 | Burwell et al. |
| 5,541,911 A | 7/1996 | Nilakantan et al. |
| 5,546,370 A | 8/1996 | Ishikawa |
| 5,555,244 A | 9/1996 | Gupta et al. |
| 5,561,669 A | 10/1996 | Lenney et al. |
| 5,583,862 A | 12/1996 | Callon |

| | | |
|---|---|---|
| 5,592,470 A | 1/1997 | Rudrapatna et al. |
| 5,598,581 A | 1/1997 | Daines et al. |
| 5,600,798 A | 2/1997 | Cherukuri et al. |
| 5,602,770 A | 2/1997 | Ohira ................... 365/49 |
| 5,604,868 A | 2/1997 | Komine et al. |
| 5,608,726 A | 3/1997 | Virgile |
| 5,617,417 A | 4/1997 | Sathe et al. |
| 5,617,421 A | 4/1997 | Chin et al. |
| 5,630,125 A | 5/1997 | Zellweger |
| 5,631,908 A | 5/1997 | Saxe |
| 5,632,021 A | 5/1997 | Jennings et al. |
| 5,634,010 A | 5/1997 | Ciscon et al. |
| 5,638,359 A | 6/1997 | Peltola et al. |
| 5,644,718 A | 7/1997 | Belove et al. |
| 5,659,684 A | 8/1997 | Giovannoni et al. |
| 5,666,353 A | 9/1997 | Klausmeier et al. |
| 5,673,265 A | 9/1997 | Gupta et al. |
| 5,678,006 A | 10/1997 | Valizadeh et al. |
| 5,680,116 A | 10/1997 | Hashimoto et al. |
| 5,684,797 A | 11/1997 | Aznar et al. |
| 5,687,324 A | 11/1997 | Green et al. |
| 5,689,506 A | 11/1997 | Chiussi et al. |
| 5,694,390 A | 12/1997 | Yamato et al. |
| 5,724,351 A | 3/1998 | Chao et al. |
| 5,740,097 A | 4/1998 | Satoh ................... 365/49 |
| 5,748,186 A | 5/1998 | Raman |
| 5,748,617 A | 5/1998 | McLain, Jr. |
| 5,754,547 A | 5/1998 | Nakazawa |
| 5,802,054 A | 9/1998 | Bellenger |
| 5,835,710 A | 11/1998 | Nagami et al. |
| 5,841,874 A | 11/1998 | Kempke et al. ............. 380/50 |
| 5,854,903 A | 12/1998 | Morrison et al. |
| 5,856,981 A | 1/1999 | Voelker |
| 5,892,924 A | 4/1999 | Lyon et al. ............ 395/200.75 |
| 5,898,686 A | 4/1999 | Virgile |
| 5,903,559 A | 5/1999 | Acharya et al. |
| 6,047,369 A * | 4/2000 | Colwell et al. ............. 712/217 |
| 6,134,135 A * | 10/2000 | Andersson ................... 365/49 |

OTHER PUBLICATIONS

Chowdhury, et al., "Alternative Bandwidth Allocation Algorithms for Packet Video in ATM Networks," INFOCOM 1992, pp. 1061–1068.

Doeringer, W., "Routing on Longest–Matching Prefixes," IEEE/ACM Transactions in Networking, vol. 4, No. 1, Feb. 1996, pp. 86–97.

Esaki, et al., "Datagram Delivery in an ATM–Internet," 2334b IEICE Transactions on Communications, Mar. 1994, No. 3, Tokyo, Japan.

IBM Corporation, "Method and Apparatus for the Statistical Multiplexing of Voice, Data and Image Signals," IBM Technical Disclosure Bulletin, No. 6, Nov. 1992, pp. 409–411.

Pei, et al., "Putting Routing Tables in Silicon," IEEE Network Magazine, Jan. 1992, pp. 42–50.

Perkins, D., "Requirements for an Internet Standard Point–to–Point Protocol," Network Working Group, RFC 1547, Dec. 1993, pp. 1–19.

Simpson, W., "The Point–to–Point Protocol (PPP),"Network Working Group, RFC 1548, Dec. 1993, pp. 1–53.

Tsuchiya, P.F., "A Search Algorithm for Table Entries with Non–Contiguous Wildcarding," Abstract, Bellcore.

Zhang, et al., "Rate–Controlled Static–Priority Queueing," INFOCOM 1993, pp. 227–236.

William Stallings, Data and Computer Communications, PP: 329–333, Prentice Hall, Upper Saddle River, New Jersey 07458.

* cited by examiner

BLOCK MASK TERNARY CAM

BACKGROUND OF THE INVENTION

1. Field of the Invention

This invention relates to a ternary CAM.

2. Related Art

In computer networks for transmitting information, routing devices are used to process incoming messages and to determine the disposition for those messages. Most messages are ultimately forwarded to their destination, using routing information maintained at the router and used in response to routing information contained in a header for the message.

One problem in the known art is that the task of processing incoming messages by the router can take substantial time. Performing additional functions besides forwarding could also increase the amount of processing time. These additional functions can include access control, quality of service features, and implementing other administrative policies. Accordingly, it would be advantageous to reduce the amount of processing time used by the router, so as to be able to route more messages in each unit time.

One known solution is to organize routing information in the router so it can be readily accessed, such as using a tree structure, a trie structure, or a hash table. While these methods of data access are relatively quick, they still take an amount of time that grows with the number of possible different selections. For example, some of these methods take about O(log N) time to perform, where N is the number of possible different selections. When the number of possible different selections is large, this can represent a substantial amount of processing time for each message. These methods of data access also have the drawback that they take variable amounts of time. This makes allocating processing time, queueing space, and other router (or switch) resources more difficult. Accordingly, it would be advantageous to be able to process each message in a known bounded time, such as O(constant) time.

One idea with promise is to use a CAM (content addressable memory) to match key information from each incoming message with a disposition for that message. However, the information used for routing has a great deal of redundancy. Having one entry in the CAM for each possible set of routing information (or even for each set of routing information known to the router), the CAM would need to be unduly large and unwieldy. Accordingly, it would be desirable to have one entry in the CAM stand for multiple sets of routing information.

One known method by which each CAM entry can stand for multiple sets of information is to provide a ternary CAM, that is, one in which each bit entry for matching is either a logical "0," a logical "1," or a logical "don't care." In known ternary CAMs, each entry for matching comprises two bits for each value bit, a first bit to indicate whether the bit need be matched at all, and a second bit to indicate (if matched) to what value the bit must match. However, by providing a mask bit for each value bit (thus, two bits total for each value bit) these known ternary CAMs have a relatively large amount of overhead. This limits the maximum size of the CAM that can be implemented in a selected chip area with a selected manufacturing technology.

Accordingly, it would be desirable to provide a method and system for flexible matching of data in a CAM that does not use the overhead of one mask bit for each matched value bit. This advantage is achieved in an embodiment of the invention in which the entries of the CAM are logically grouped in a set of blocks, each block having a single mask that applies to all entries in the block.

SUMMARY OF THE INVENTION

The invention provides a method and system for flexible matching of data in a CAM that does not use the overhead of one mask bit for each matched value bit. The entries of the CAM are logically grouped in a set of blocks, each block having a single mask that applies to all entries in the block. In a preferred embodiment, each block includes a predetermined number of CAM entries, such as a block of 16 entries. However, in alternative embodiments, the number of CAM entries for each block could be predetermined to be a different number, or could be dynamically selected with the values that are entered into the CAM.

DETAILED DESCRIPTION OF THE PREFERRED EMBODIMENT

In the following description, a preferred embodiment of the invention is described with regard to preferred process steps and data structures. Those skilled in the art would recognize after perusal of this application that embodiments of the invention can be implemented using circuits adapted to particular process steps and data structures described herein, and that implementation of the process steps and data structures described herein would not require undue experimentation or further invention.

System Elements

Figure 1:
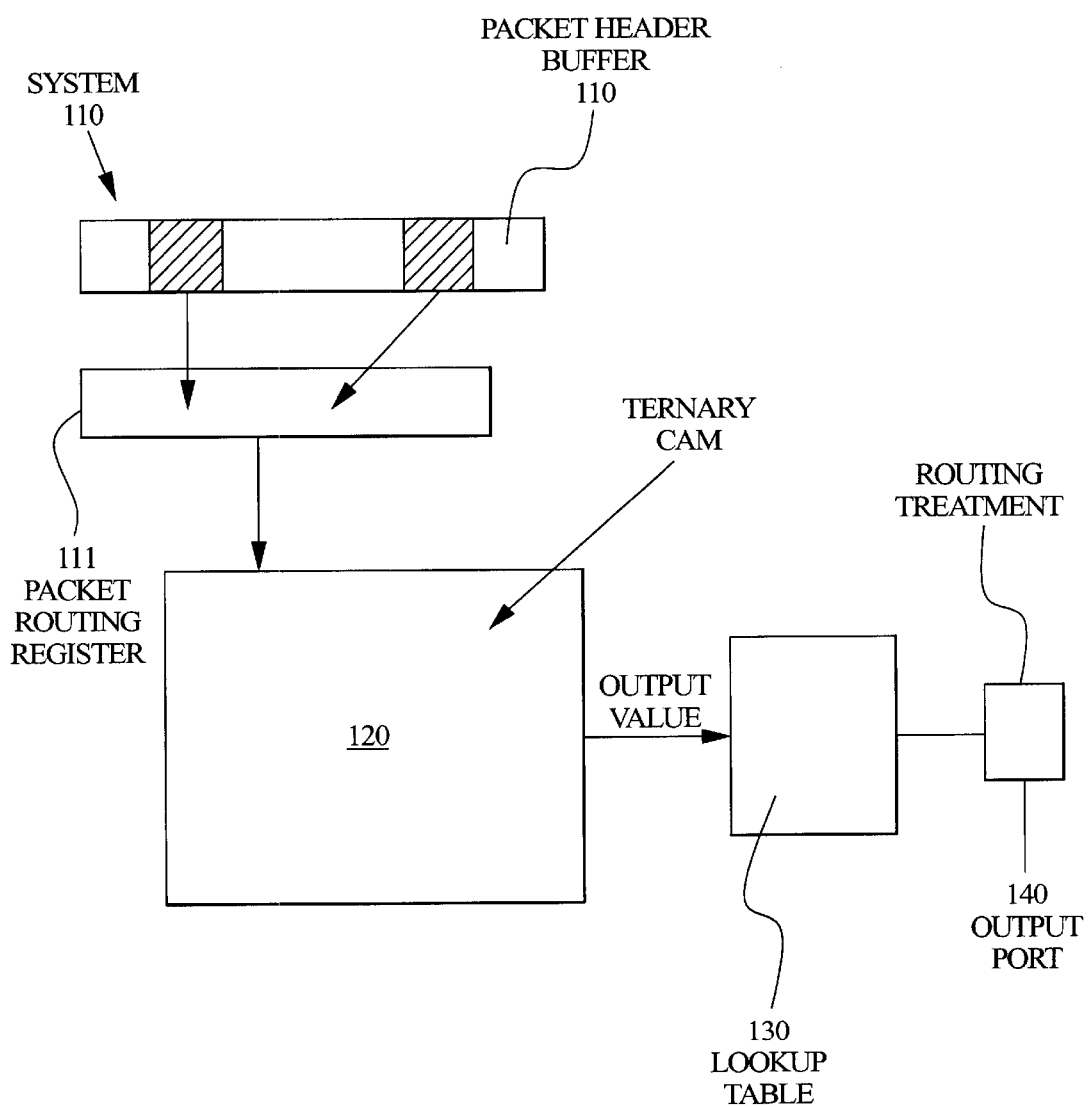
FIG. 1 shows a block diagram of a system for routing lookup using a ternary CAM.

FIG. 1 shows a block diagram of a system for routing lookup using a ternary CAM.

A system 100 for routing lookup includes a packet header buffer 110, a ternary CAM 120, a lookup table 130, and an output port 140.

The packet header buffer 110 includes selected information from a header for a packet to be routed. The selected information includes a destination address from the packet header, and can also include a source address from the packet header.

Although a preferred embodiment is described with regard to certain routing and transmission protocols, such as IP (internet protocol) or variants thereof, the invention is also applicable to a wide variety of routing and transmission protocols, such as IPX, variants thereof, or other known routing or transmission protocols.

In a preferred embodiment, the selected information from the packet header can include information such as described in the following patent applications:

U.S. application Ser. No. 08/581,134, titled "Method For Traffic Management, Traffic Prioritization, Access Control, and Packet Forwarding in a Datagram Computer Network", filed Dec. 29, 1995, in the name of inventors David R. Cheriton and Andreas V. Bechtolsheim, assigned to Cisco Technology, Inc.

U.S. application Ser. No. 08/655,429, titled "Network Flow Switching and Flow Data Export", filed May 28, 1996, in the name of inventors Darren Kerr and Barry Bruins, and assigned to Cisco Technology, Inc., attorney docket number, and U.S. application Ser. No. 08/771,438, titled "Network Flow Switching and Flow Data Export", filed Dec. 20, 1996, in the name of inventors Darren Kerr and Barry Bruins, assigned to Cisco Technology, Inc., attorney docket number.

These applications are collectively referred to herein as the "Netflow Switching Disclosures". Each of these applications is hereby incorporated by reference as if fully set forth herein.

The system 100 couples the selected information from the packet header buffer 110 to a packet routing register 111. The packet routing register 111 includes the selected information, plus an identifier for its associated packet, so that the associated packet can be reunited with the selected information after a routing treatment is selected for the packet.

The selected information from the packet header buffer 110 is coupled to the ternary CAM 120.

The ternary CAM 120 is disposed for receiving the selected information from the packet header buffer 110 as an input value. The CAM 120 includes a plurality of content addressable entries, each of which is responsive to the input value. If one or more of the entries matches the input value, it provides an output pointer responsive thereto. The CAM 120 selects one of those output pointers as its output value.

The output value from the CAM 120 is coupled to the lookup table 130. The lookup table 130 is responsive to the output value from the CAM 120, and is disposed for providing a routing treatment for the packet. The routing treatment for the packet is coupled to the output port 140.

The system 100 includes a set of elements (not shown) for performing bookkeeping processing for packets, including (a) identifying packet headers, (b) buffering packet data, and (c) reuniting packet headers with corresponding packets. The system 100 also includes a processor (not shown) for performing more complex tasks with regard to packets, such as can be indicated by the routing treatment at the output port 140.

The routing treatment at the output port 140 can include a variety of types of information about how to treat the packet, including one or more of the following:

A routing decision for the packet. This can include an output interface on which to forward the packet, an indicator to drop the packet, or an indicator that the packet should be forwarded to the processor for further routing decision treatment.

An access control decision for the packet. This can include an instruction to allow forwarding for the packet, an instruction to deny forwarding for the packet, or an indicator that the packet should be forwarded to the processor for further access control treatment.

A quality of service decision for the packet.

An accounting decision for the packet. This can include an account to be charged for the packet, a type of packet to be counted for data collection, or a decision for the packet that implements one or more other accounting purposes.

A decision for the packet that implements one or more other administrative policies.

These types of information can be recorded in a single region of the lookup table 130, or in a plurality of regions of the lookup table 130 (such as one region for each type of information).

Ternary CAM Block Masking

Figure 2:
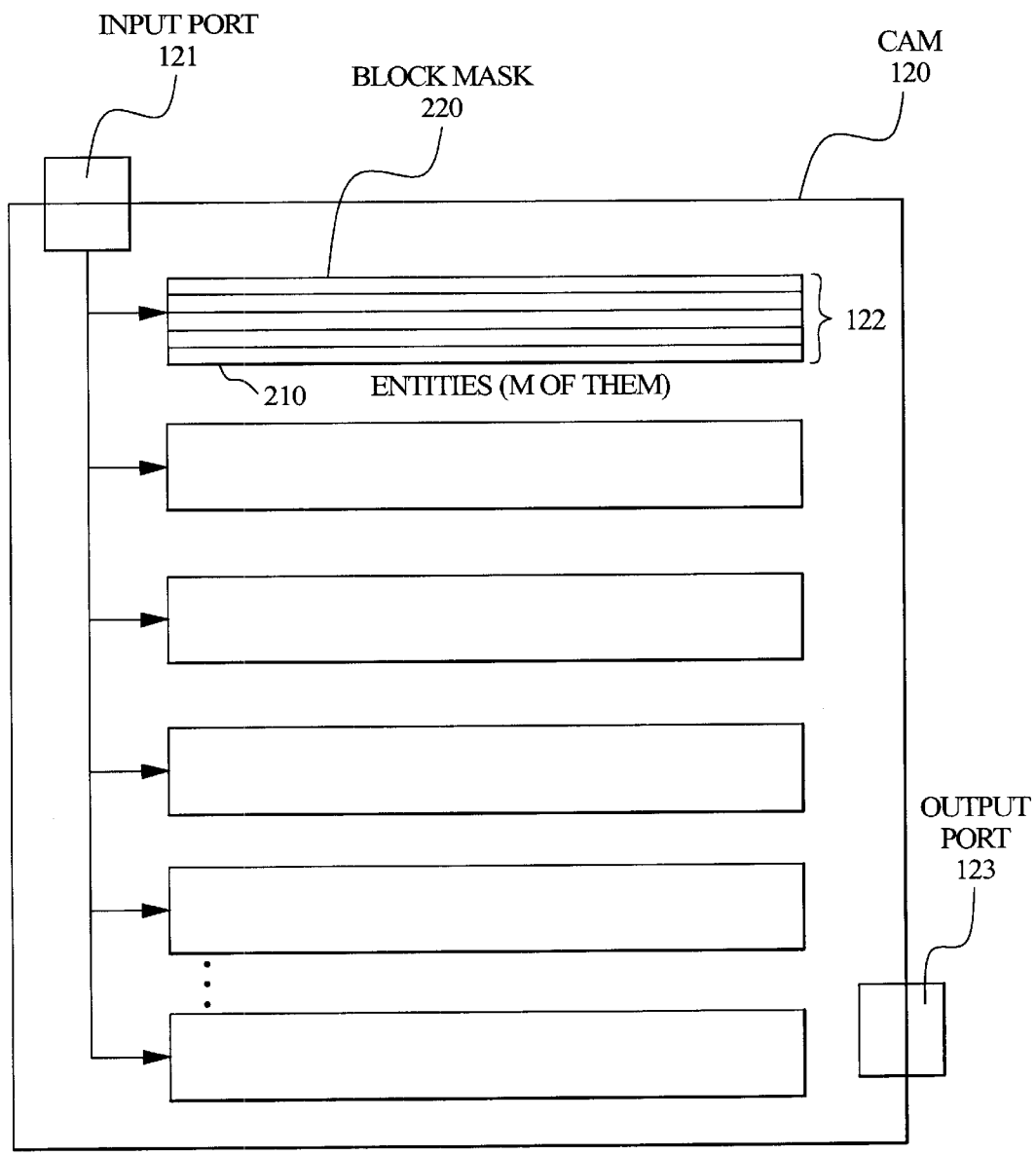
FIG. 2 shows a block diagram of a ternary CAM with a set of block masks.

FIG. 2 shows a block diagram of a ternary CAM 120 with a set of block masks.

The CAM 120 includes an input port 121, a plurality of entry blocks 122, and an output port 123.

The input port 121 is coupled to the selected information from the packet header buffer 110 and is disposed for receiving the input value for the CAM 120 therefrom. The input port 121 is coupled to each of the entry blocks 122 and is disposed for transmitting the input value to each one.

Each entry block 122 includes a plurality M of content addressable entries 210, each having a separate entry matching value, and a single block mask entry 220, having a single entry matching mask. Thus, the number of entry matching values exceeds the number of entry matching masks by a factor of M.

In a preferred embodiment, the value of M is about 16, although values of 8 or 32 would also be workable. There is no particular requirement that the value of M need be a power of two.

There is also no particular requirement that the value of M need be the same for each entry block 122. Thus for example, the CAM 120 can include a first set of entry blocks 122 each having a value of M equal to 16, and a second set of entry blocks 122 each having a value of M equal to 32.

There is also no particular requirement that the value of M need be static for each entry block 122. Thus, the CAM 120 can include at least one entry block 122 having a plurality N of block masks, and include the capability for dividing that entry block 122 into separate functional entry blocks 122 each responsive to a different one of the plurality of block masks.

For example, the CAM 120 can include one particular entry block 122 with a value of M equal to 32, and having a value of N equal to two (that is, two independent block masks 220). The CAM 120 can have the capability of splitting that entry block 122 into first and second functional entry blocks 122. Each of the first and second functional entry blocks 122 could have a value of M equal to 16, and a value of N equal to one (that is, a single independent block mask 220 for each of the functional entry blocks 122).

Each one of the M content addressable entries 210 is responsive to the input value coupled from the input port 121, to its entry matching value, and to its associated entry matching mask. For each entry 210, the input value is compared against both its entry matching value and its associated entry matching mask. The input value is considered to match the entry if each bit of the input value either (a) matches a corresponding bit of the entry matching value, or (b) is masked by a corresponding bit of the entry matching mask.

Method of Operation

Figure 3:
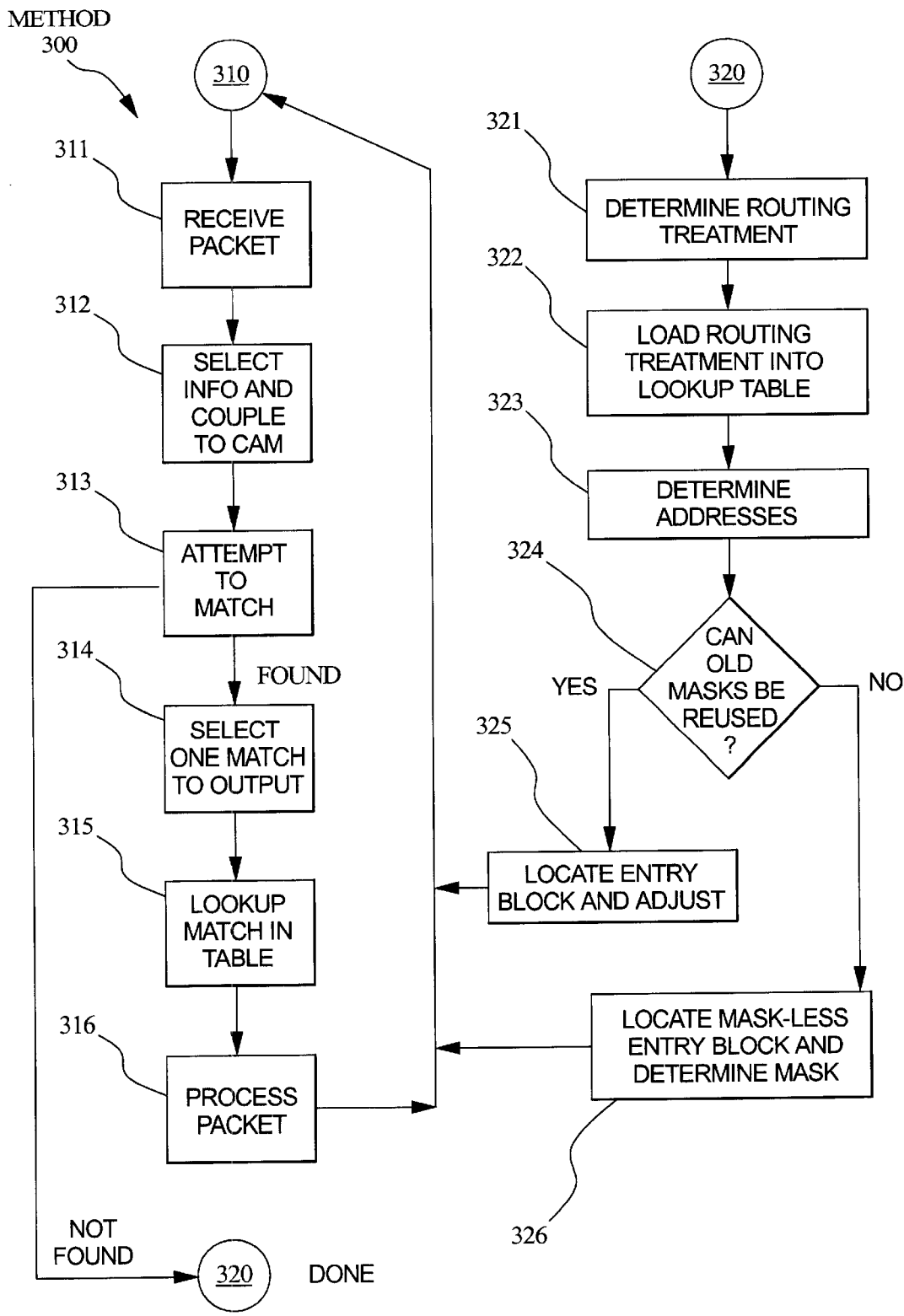
FIG. 3 shows a flow diagram of a method for loading and using the ternary CAM with block masks.

FIG. 3 shows a flow diagram of a method for loading and using the ternary CAM with block masks.

A method 300 is performed collectively by the system 100, including the packet header buffer 110, the ternary CAM 120, the lookup table 130, the output port 140, and the processor (not shown).

At a flow point 310, the system 100 is ready to receive a packet.

At a step 311, the system 100 receives a packet. The system 100 records a packet header for the packet in the packet header buffer 110.

As noted above, the packet header includes information about routing treatment for the packet, which can include one or more of: a routing decision, an access control decision, a quality of service decision, an accounting decision, and another administrative decision.

At a step 312, the system 100 selects information from the packet header and couples that information to the CAM 120. That information can include a destination address for the packet and possibly a source address for the packet.

At a step 313, the CAM 120 attempts to match the input value at its input port 121, in response to matching values and mask values for each of its entry blocks 122. If the CAM 120 finds at least one match, the method proceeds with the next step. If the CAM 120 does not find any match, the method proceeds with the flow point 320.

At a step 314, the CAM 120 selects one of the (one or more) matches as an output value, and couples that output value to the lookup table 130.

At a step 315, the lookup table 130, responsive to the output value from the CAM 120, provides a selected routing treatment for the packet.

At a step 316, the system 100 processes the packet according to the selected routing treatment. The method 300 is ready for another packet and returns to the flow point 310.

At a flow point 320, the system 100 has received a packet for which it does not have a routing treatment.

At a step 321, the processor determines a routing treatment for the packet.

At a step 322, the system 100 loads the routing treatment into the lookup table 130.

At a step 323, the system 100 determines the addresses for referencing the packet in the CAM 120.

At a step 324, the system 100 determines if the masks associated with other entries in the CAM 120 can be used for referencing the new routing treatment, so that the addresses for referencing the packet can be treated together with other addresses already recorded in the CAM 120. If so, the method proceeds with the step 325. If not, the method proceeds with the step 326.

The nature of processing in the step 324 is further illuminated by information available in a published RFC relating to CIDR (classless inter-domain routing).

At a step 325, the system 100 locates an entry block 122 already having a correct mask for the new address. The system 100 adjusts the entry mask value for that entry block 122 so that entry block 122 matches the new address and the new routing treatment as well.

In a preferred embodiment, the system 100 can select an entry block 122 with additional space, or select a new entry block 122, responsive to the new address, so as to reserve such additional space in one or more entry blocks 122.

The system 100 is then ready to receive a new packet, and the method 300 proceeds with the flow point 310.

At a step 326, the system 100 locates an entry block 122 not already having an assigned mask and routing treatment. The system 100 determines a mask for the new address, and adjusts the entry mask value for that entry block 122 so that entry block 122 matches the new address. The system 100 adjusts the output value for that entry block 122 to indicate the correct routing treatment for the new address.

The system 100 is then ready to receive a new packet, and the method 300 proceeds with the flow point 310.

ALTERNATIVE EMBODIMENTS

Although preferred embodiments are disclosed herein, many variations are possible which remain within the concept, scope, and spirit of the invention, and these variations would become clear to those skilled in the art after perusal of this application.

What is claimed is:

1. A content addressable memory, comprising:
    a plurality V of value entries;
    a plurality M of mask entries; and
    a plurality of sections, each said section comprising one said mask entry and a plurality of said value entries;
    wherein M is less than V; and
    wherein said plurality of sections comprises a first section having either a first number or a second number of said value entries, a choice of said first number or said second number being dynamically selectable in response to a content element in said memory.

2. A content addressable memory, comprising:
    a plurality V of value entries;
    a plurality M of mask entries; and
    a plurality of sections, each said section comprising one said mask entry and a plurality of said value entries;
    wherein M is less than V; and
    wherein said plurality of sections comprises a first section having either a first number or a second number of said value entries, a choice of said first number or said second number being dynamically selectable in response to a lookup header for a packet.

3. A content addressable memory, comprising:
    a plurality V of value entries;
    a plurality M of mask entries; and
    a plurality of sections, each said section comprising one said mask entry and a plurality of said value entries;
    wherein M is less than V; and
    wherein said plurality of sections comprises a first section having a first number of said value entries; and
    a second section having a second number of said value entries; and
    wherein said first number and said second number are different.

4. The memory as in claim 3, wherein said first section comprises:
    either a first number or a second number of said value entries, a first choice of said first number or said second number for said first section being dynamically selectable in response to a content element in said memory; and
    said second section comprises either a first number or a second number of said value entries, a second choice of said first number or said second number for said second section being dynamically selectable in response to a content element in said memory and independently of said first choice.

5. The memory as in claim 3, wherein said first section comprises:
    either a first number or a second number of said value entries, a first choice of said first number or said second number for said first section being dynamically selectable in response to a lookup header for a packet; and
    said second section comprises either a first number or a second number of said value entries, a second choice of said first number or said second number for said second section being dynamically selectable in response to a content element in said memory and independently of said first choice.

6. A content addressable memory, comprising:
    a plurality M of mask entries;
    for each one of said mask entries, a plurality of value entries associated therewith; and a plurality of sections, each said section comprising one said mask entry and said plurality of said value entries; and wherein said plurality of sections comprises a first section having either a first number or a second number of said value entries, a choice of said first number or said second number being dynamically selectable in response to a content element in said memory.

7. A content addressable memory, comprising:

a plurality M of mask entries;

for each one of said mask entries, a plurality of value entries associated therewith; and a plurality of sections, each said section comprising one said mask entry and said plurality of said value entries; and wherein said plurality of sections comprises a first section having either a first number or a second number of said value entries, a choice of said first number or said second number being dynamically selectable in response to a lookup header for a packet.

8. A content addressable memory, comprising:

a plurality M of mask entries;

for each one of said mask entries, a plurality of value entries associated therewith; and a plurality of sections, each said section comprising one said mask entry and said plurality of said value entries; and wherein said plurality of sections comprises:

a first section having a first number of said value entries; and a second section having a second number of said value entries;

wherein said first number and said second number are different.

9. The memory as in claim 8, wherein said first section comprises either a first number or a second number of said value entries, a first choice of said first number or said second number for said first section being dynamically selectable in response to a content element in said memory; and said second section comprises either a first number or a second number of said value entries, a second choice of said first number or said second number for said second section being dynamically selectable in response to a content element in said memory and independently of said first choice.

10. The memory as in claim 8, wherein said first section comprises either a first number or a second number of said value entries, a first choice of said first number or said second number for said first section being dynamically selectable in response to a lookup header for a packet; and said second section comprises either a first number or a second number of said value entries, a second choice of said first number or said second number for said second section being dynamically selectable in response to a lookup header for a packet and independently of said first choice.

11. A method of operating a content addressable memory, said method comprising the steps of:

matching an input against a plurality V of value entries, each said value entry having a number B of bits;

matching said input against a plurality M of mask entries, M being less than V, each said mask entry having a number B of bits;.

determining for each one of said value entries, a matching result responsive to a logical function of (a) each bit of said input, (b) a corresponding bit of said one value entry, and (c) a corresponding bit of one of said mask entries associated with said one value entry; and producing an output responsive to said matching results.

12. The method as in claim 11, wherein each said mask entry is associated with a discrete set of said value entries.

13. The method as in claim 12, wherein said discrete set includes either a first number or a second number of said value entries; and comprising the step of dynamically choosing said first number or said second number in response to a content element in said memory.

14. The method as in claim 12, wherein said discrete set includes either a first number or a second number of said value entries; and comprising the step of dynamically choosing said first number or said second number in response to a lookup header for a packet.

15. The method as in claim 12, wherein said memory includes a first mask entry having a first number of said value entries in said associated discrete set; and a second mask entry having a second number of said value entries in said associated discrete set; wherein said first number and said second number are different.

16. The method as in claim 15, wherein said first mask entry has either a first number or a second number of said value entries in said associated discrete set;

said second mask entry has either a first number or a second number of said value entries in said associated discrete set; and comprising the steps of:

making a first dynamic choice, for said first mask entry, of either said first number or said second number, in response to a content element in said memory; and making a second dynamic choice, for said second mask entry, of either said first number or said second number, in response to a content element in said memory and independently of said first choice.

17. The method as in claim 15, wherein said first mask entry has either a first number or a second number of said value entries in said associated discrete set;

said second mask entry has either a first number or a second number of said value entries in said associated discrete set; and comprising the steps of:

making a first dynamic choice, for said first mask entry, of either said first number or said second number, in response to a content element in said memory; and making a second dynamic choice, for said second mask entry, of either said first number or said second number, in response to a lookup header for a packet and independently of said first choice.

18. The method as in claim 11, wherein said logical function is responsive to whether said bit of said input matches said corresponding bit of said one value entry; and whether said corresponding bit of one of said mask entries equals a predetermined logical value.

19. The method as in claim 18, wherein each said mask entry is associated with a discrete set of said value entries.

20. The method as in claim 19, wherein said discrete set includes either a first number or a second number of said value entries; and comprising the step of dynamically choosing said first number or said second number in response to a content element in said memory.

21. The method as in claim 19, wherein said discrete set includes either a first number or a second number of said value entries; and comprising the step of dynamically choosing said first number or said second number in response to a lookup header for a packet.

22. The method as in claim 19, wherein said memory includes
- a first mask entry having a first number of said value entries in said associated discrete set; and
- a second mask entry having a second number of said value entries in said associated discrete set; wherein said first number and said second number are different.

23. The method as in claim 22, wherein
said first mask entry has either a first number or a second number of said value entries in said associated discrete set;
said second mask entry has either a first number or a second number of said
value entries in said associated discrete set; and
comprising the steps of:
- making a first dynamic choice, for said first mask entry, of either said first number or said second number, in response to a content element in said memory; and
- making a second dynamic choice, for said second mask entry, of either said first number or said second number, in response to a content element in said memory and independently of said first choice.

24. The method as in claim 22, wherein
said first mask entry has either a first number or a second number of said value entries in said associated discrete set;
said second mask entry has either a first number or a second number of said value entries in said associated discrete set; and
comprising the steps of:
- making a first dynamic choice, for said first mask entry, of either said first number or said second number, in response to a lookup header for a packet; and
- making a second dynamic choice, for said second mask entry, of either said first number or said second number, in response to a lookup header for a packet and independently of said first choice.

25. A method of operating a content addressable memory, said method comprising the steps of:
- matching an input against a plurality M of mask entries, each said mask entry having a number B of bits;
- for each one of said mask entries, matching said input against a plurality of value entries associated therewith, each said value entry having a number B of bits;
- determining for each one of said value entries, a matching result responsive to a logical function of (a) each bit of said input, (b) a corresponding bit of said one mask entry associated therewith, and (c) a corresponding bit of said one value entry; and
- producing an output responsive to said matching results.

26. The method as in claim 25, wherein each said mask entry is associated with a discrete set of said value entries.

27. The method as in claim 26, wherein said discrete set includes either a first number or a second number of said value entries; and comprising the step of dynamically choosing said first number or said second number in response to a content element in said memory.

28. The method as in claim 26, wherein said discrete set includes either a first number or a second number of said value entries; and comprising the step of dynamically choosing said first number or said second number in response to a lookup header for a packet.

29. The method as in claim 26, wherein said memory includes
- a first mask entry having a first number of said value entries in said associated discrete set; and
- a second mask entry having a second number of said value entries in said associated discrete set; wherein said first number and said second number are different.

30. The method as in claim 29, wherein
said first mask entry has either a first number or a second number of said value entries in said associated discrete set;
said second mask entry has either a first number or a second number of said value entries in said associated discrete set; and
comprising the steps of
- making a first dynamic choice, for said first mask entry, of either said first number or said second number, in response to a content element in said memory; and
- making a second dynamic choice, for said second mask entry, of either said first number or said second number, in response to a content element in said memory and independently of said first choice.

31. The method as in claim 29, wherein
said first mask entry has either a first number or a second number of said value entries in said associated discrete set;
said second mask entry has either a first number or a second number of said value entries in said associated discrete set; and
comprising the steps of:
- making a first dynamic choice, for said first mask entry, of either said first number or said second number, in response to a lookup header for a packet; and
- making a second dynamic choice, for said second mask entry, of either said first number or said second number, in response to a lookup header for a packet and independently of said first choice.

32. The method as in claim 25, wherein said logical function is responsive to whether said bit of said input matches said corresponding bit of said one value entry; and whether said corresponding bit of one of said mask entries equals a predetermined logical value.

33. The method as in claim 32, wherein each said mask entry is associated with a discrete set of said value entries.

34. The method as in claim 33, wherein said discrete set includes either a first number or a second number of said value entries; and comprising the step of dynamically choosing said first number or said second number in response to a content element in said memory.

35. The method as in claim 33, wherein said discrete set includes either a first number or a second number of said value entries; and comprising the step of dynamically choosing said first number or said second number in response to a lookup header for a packet.

36. The method as in claim 33, wherein said memory includes
- a first mask entry having a first number of said value entries in said associated discrete set; and
- a second mask entry having a second number of said value entries in said associated discrete set; wherein said first number and said second number are different.

37. The method claim 36, wherein
said first mask entry has either a first number or a second number of said value entries in said associated discrete set;
said second ask entry has either a first number or a second number of said value entries in said associated discrete set; and comprising the steps of:
   making a first dynamic choice, for said first mask entry, of either said first number or said second number, in response to a content element in said memory; and
   making a second dynamic choice, for said second mask entry, of either said first number or said second number, in response to a content element in said memory and independently of said first choice.

38. The method as in claim 36, wherein said first mask entry has either a first number or a second number of said value entries in said associated discrete set;

said second mask entry has either a first number or a second number of said value entries in said associated discrete set; and comprising the steps of:
   making a first dynamic choice, for said first mask entry, of either said first number or said second number, in response to a lookup header for a packet; and
   making a second dynamic choice, for said second mask entry, of either said first number or said second number, in response to a lookup header for a packet and independently of said first choice.

* * * * *

UNITED STATES PATENT AND TRADEMARK OFFICE
CERTIFICATE OF CORRECTION

PATENT NO.   : 6,389,506 B1                                                      Page 1 of 1
DATED        : May 14, 2002
INVENTOR(S)  : Mark Ross and Andreas V. Bechtolsheim It is certified that error appears in the above-identified patent and that said Letters Patent is hereby corrected as shown below:

<u>Column 10,</u>
Line 61, after "method" insert -- as in --.
Line 65, replace "ask" with -- mask --.

Signed and Sealed this

Third Day of September, 2002

Attest:

Attesting Officer

JAMES E. ROGAN
*Director of the United States Patent and Trademark Office*